(12) United States Patent
Yang

(10) Patent No.: US 6,806,457 B2
(45) Date of Patent: Oct. 19, 2004

(54) TRANSISTOR PHOTOELECTRIC CONVERSION DRIVE CIRCUIT

(76) Inventor: Tai-Her Yang, No. 59, Chung Hsing 8 St., Si-Hu Town, Dzan-Hwa (TW)

(*) Notice: Subject to any disclaimer, the term of this patent is extended or adjusted under 35 U.S.C. 154(b) by 326 days.

(21) Appl. No.: 09/964,323

(22) Filed: Sep. 28, 2001

(65) Prior Publication Data
US 2003/0062945 A1 Apr. 3, 2003

(51) Int. Cl.[7] .................................................. H01J 40/14
(52) U.S. Cl. .................................. 250/214 R; 327/514
(58) Field of Search .......................... 250/214 R, 214 P, 250/214 C, 214 RC, 214 SF, 214 AL, 210, 206; 327/514, 515

(56) References Cited

U.S. PATENT DOCUMENTS 4,025,791 A * 5/1977 Lennington et al. ...... 250/341.1
4,461,963 A * 7/1984 Koomen ...................... 327/143
5,055,686 A * 10/1991 Jones ...................... 250/370.01

FOREIGN PATENT DOCUMENTS

JP      401032084 A   *  2/1989

* cited by examiner

Primary Examiner—Kevin Pyo
(74) Attorney, Agent, or Firm—Bacon & Thomas, PLLC

(57) ABSTRACT

A transistor photoelectric conversion drive circuit to excite coupled photoelectric conversion device by electric energy driven light emission device or natural light source in the environment to generate electric energy of positive voltage to drive metal-oxide-silicon field effect transistor (MOSFET) or insulated gate bi-carrier transistor (IGBT) or any other high input resistance transistor while electric energy is stored at a slave negative voltage supply circuit device by means of the electric energy of positive voltage so that upon the signal of positive voltage is cut off, negative voltage is inputted to gate and emitter of one or more than one high input resistance transistors to facilitate cutoff.

23 Claims, 10 Drawing Sheets

TRANSISTOR PHOTOELECTRIC CONVERSION DRIVE CIRCUIT

BACKGROUND OF THE INVENTION (a) Field of the Invention

The present invention relates to an photoelectric conversion drive circuit of a transistor, and more particularly, to one that includes a matching electric energy driven light emission device, e.g. an LED, a light bulb, or any other type of light emission device or natural light source; a device coupled to the matching photoelectric conversion light emission device, such as the electricity storage device of a photoelectric crystal or a non-crystal system for causing the light emission device to emit light; and a photoelectric effect device that generates micro-current when subject to light, for transmission to a high input resistance type of transistor, such as a micro or power type metal-oxide-silicon field effect transistor (MOSFET), insulated gate bipolar transistor (IGBT), or other high input resistance transistor, or a gate and source of a high input resistance transistor module to cause the transistor or module to conduct and to simultaneously supply electric energy for storage by a slave type negative voltage circuit device so that upon cut off, a negative voltage is generated for input to the gate and source of one or more than one high resistance transistors for facilitating the cut-off.

(b) Description of the Prior Art

A high input resistance transistor such as a metal-oxide-silicon field effect transistor (MOSFET), an insulated gate bipolar transistor IGBT, or any other type of high input resistance transistor or module having its operation controlled by a drive voltage has been developed only in recent years. In addition to functioning as a solid-state high power switch, the high input resistance transistor may conveniently be applied in a micro-electronic logic operation or data memory storage circuit device, a detection circuit device, or other circuits. However, the input end for controlling the operation of the high input resistance transistor, e.g., a MOSFET, IGBT or other types of high input resistance transistor or module, is of high resistance type. The matching current of its drive signal is very small (approaching zero). Since the drive voltage must reach a pre-set value to ensure of normal operation, a larger resistance is observed between drain and source if the voltage between the gate and source gets too low, and thus the high resistance input transistor may be burnt out due to increased thermal loss. Such a disadvantage limits application of the transistor in applications involving an occasionally lower input voltage. Preferably, the drive signal for the IGBT should not be less than 12V.

SUMMARY OF THE INVENTION

The primary purpose of the present invention is to provide a drive circuit for a metal-oxide-silicon field effect transistor (MOSFET), an insulated gate bipolar transistor (IGBT), or any other type of high input resistance transistor, in which an electric energy driven light emission device or an environmental light source is used to excite a device coupled to the photoelectric conversion light emission device or environmental light source, and cause the light emission device or light source to generate electric energy of positive voltage; and to supply a negative voltage to the gate and emitter of one or more than one high resistance transistor to facilitate cutting off of the at least one transistor without a sudden drop in the gate to source voltage.

DETAILED DESCRIPTION OF THE PREFERRED EMBODIMENTS

Figure 1:
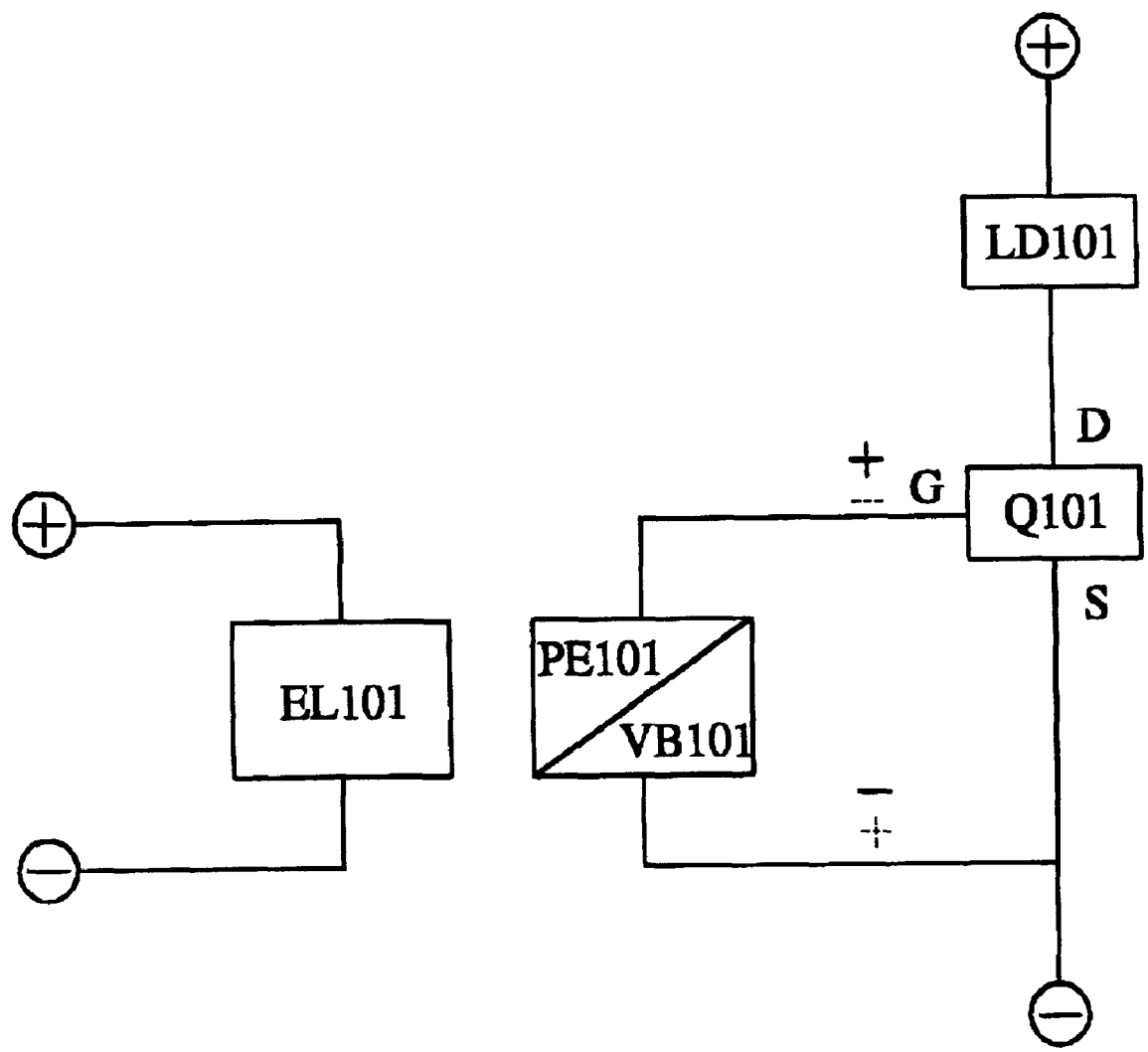
FIG. 1 is a block diagram showing a basic circuit of a photoelectric conversion transistor drive circuit according to the present invention.

FIG. 1 is a block diagram showing a basic photoelectric conversion drive circuit for a transistor according to the present invention. The photoelectric conversion drive circuit illustrated in FIG. 1 is essentially comprised of:

a high input resistance transistor Q101 made up of one or more than one type of high input resistance transistor devices, including single unit, single polarity devices or devices made up of two units inversely connected in parallel, or a bridge type high input resistance transistor such as a metal-oxide-silicon field effect transistor (MOSFET) or an insulated gatebipolar bipolar transistor (IGBT), or other high input resistance transistor, transistor module, or gate, or a logic operation or data memory storage system, detection device, or other circuit that is driven by a positive voltage drive signal;

a photoelectric conversion device PE101 made up of a crystal or non-crystal system photo device that generates electric energy output when subject to light, or other type of photoelectric conversion device arranged to receive photo energy from an environmental light source or an electric energy driven light emission device EL101, and then convert the photo energy into a minimum drive voltage required to drive the high input resistance transistor Q101; the electric energy driven light emission device EL101 including one or light emitting diodes (LEDs), electric bulbs, or any other type of photoelectric conversion device matched to the photoelectric conversion device PE101 in such a way that the photo energy outputted by the light emission device generates the minimum drive voltage required by the photoelectric conversion device PE101; one or more of the electric energy driven light emission devices EL101 being used to drive one or more that one photoelectric conversion device PE101, either individually or jointly;

a slave negative voltage supply device VB101 comprised of a solid state or electro-mechanical device to provide a negative voltage between the gate and source of the transistor upon cutting off positive voltage transmission to the control gate of the high input resistance transistor Q101, for facilitating cutoff of the high input resistance transistor Q101; wherein upon delivery of the positive voltage electric energy signal controlling the drive, or when the photoelectric conversion device PE101 receives photo energy emitted from the electric energy driven light emission device EL101 or from the environment to generate positive a voltage to drive the high input resistance transistor Q101, the slave negative voltage supply circuit device VB101 executes storage of negative voltage by utilizing the electric energy of the inputted positive voltage signal so that when the positive voltage signal being transmitted to the high input resistance transistor Q101 is interrupted, the slave negative voltage supply circuit device VB101 inputs negative voltage to the controlling gate and source of the high input resistance transistor Q101 to facilitate cut-off transition; the negative voltage electric energy of the slave negative voltage supply circuit device VB101 being provided by photoelectric conversion devices PE101, by an independently provided photoelectric conversion device PE102, or by positive voltage electric energy from another drive signal source; and the negative voltage storage being in the form of an electro-mechanical device, an inductive device, a capacitive device, a (dis)chargeable secondary battery, a super capacitor, or any other type of electricity storage device for storing the positive voltage electric energy required for driving the high input resistance transistor Q101;

a load device LD101 in the form of a load arranged to convert electrical energy into mechanical energy, light, or heat, a load arranged to provide an electrochemical effect, any other power load comprised of resistive, capacitive, inductive elements, a transistor, a diode or any other solid state or electro-mecanical load device, any circuit having the function of post amplification, any load for signal transmission, or any load for data storage, read-out, elimination, operation, any load functioning as a detection circuit device, or any other circuit load subject to the control by the high input resistance transistor Q101.

By combining the devices disclosed above, photoelectric conversion device PE101 will generate a drive voltage under normal conditions of being subject to light, while the slave negative voltage supply circuit device VB101, provided between the gate and the source of a high input resistance transistor such as a micro or power type metal-oxide-silicon field effect transistor (MOSFET), insulated gate bipolar transistor (IGBT), or other type of high input resistance transistor or module, stores electric energy to provide a cut-off voltage when photoelectric conversion by the conversion device PE101 ceases.

The structural configuration of the photoelectric conversion drive circuit of the transistor is described as follows:

(1) Depending on structural requirements, the electric energy driven light emission device EL101, the photoelectric conversion device PE101 and the slave negative voltage supply circuit device VB101 may be of individual structure, or mutually coupled, or partially or generally coupled to form a sealed configuration;

(2) Depending on structural requirements, the electric energy driven light emission device EL101, the photoelectric conversion device PE101 and the slave negative voltage supply circuit device VB101 may be partially or generally separately provided or packed into a module with the high input resistance transistor Q101;

(3) Each and all related circuit devices may be directly connected or connected via an I/C or a PCB to form an open structure or a hybrid structure;

(4) A drive source for the energy driven light emission device EL101 referred in subparagraphs (1), (2) and (3) may be of DC or AC source to drive a bulb, a DC source to drive a light emission diode (LED), or a laser light source or other electric energy excited electric energy driven light emission device, or a natural light source from the environment may be substituted.

Figure 2:
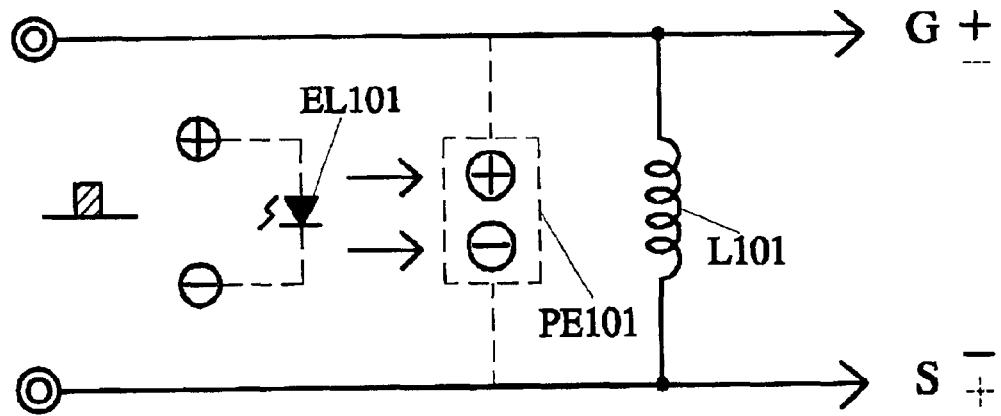
FIG. 2 is a view showing a slave negative voltage supply circuit including a parallel-connected inductor.
Figure 3:
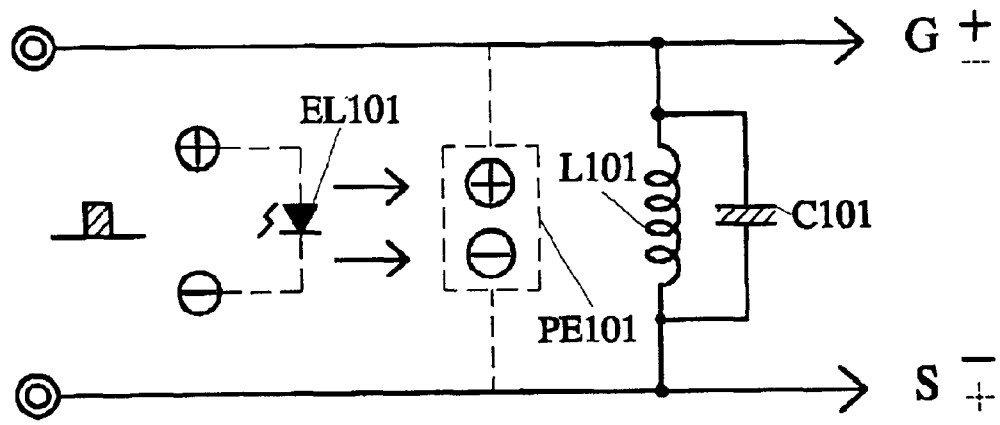
FIG. 3 is a view showing a slave negative voltage supply circuit including a parallel-connected inductor and capacitor.
Figure 4:
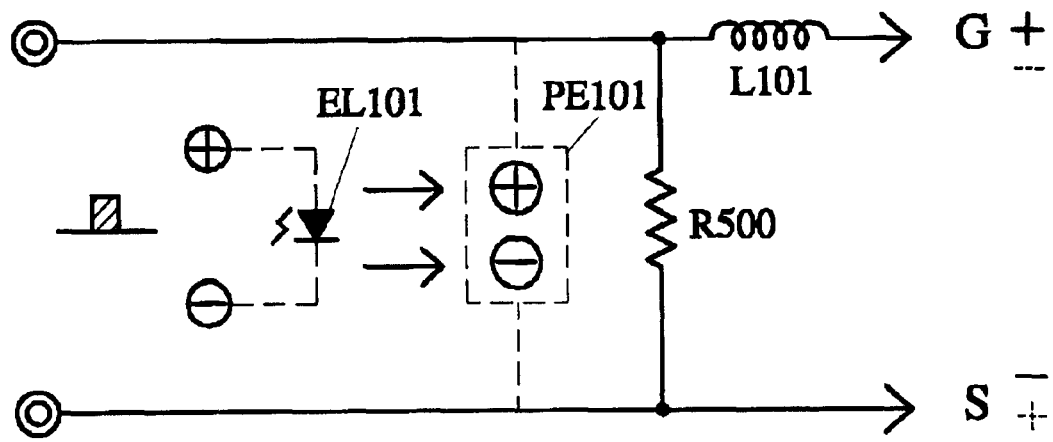
FIG. 4 is a view showing a slave negative voltage supply circuit including a series-connected inductor.
Figure 5:
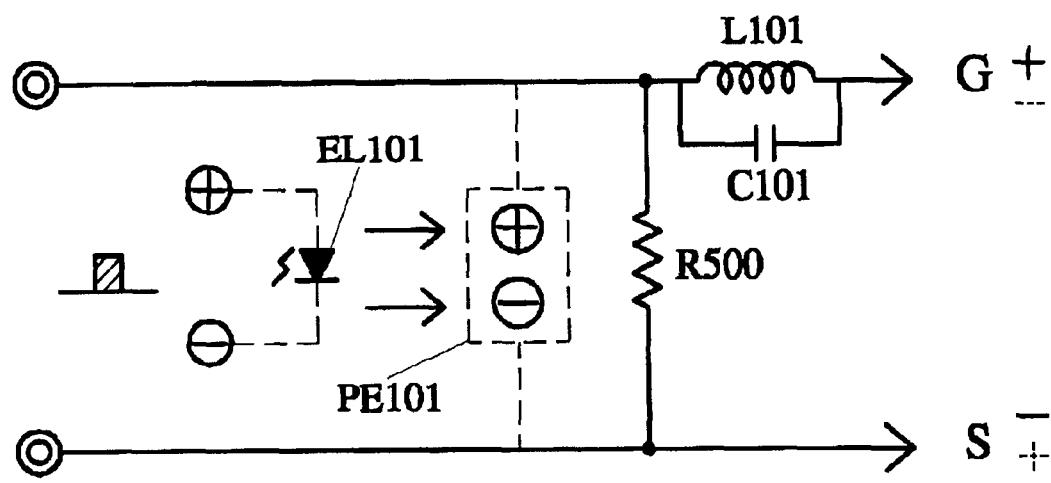
FIG. 5 is a view showing in series with induction and capacitors in parallel to form a slave negative voltage supply circuit.
Figure 6:
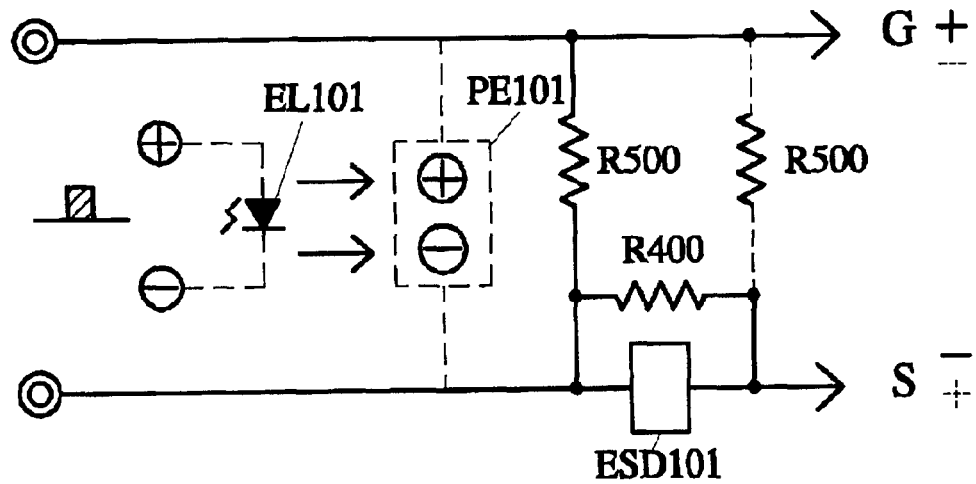
FIG. 6 is a view showing a slave negative voltage supply circuit including a series-connected resistance and secondary battery.
Figure 7:
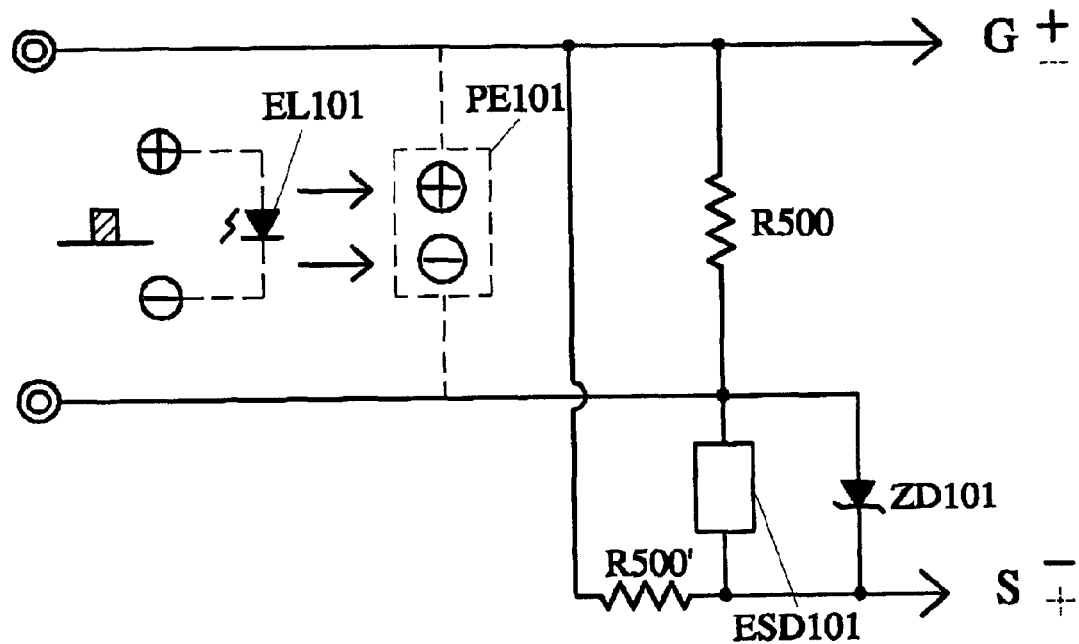
FIG. 7 is a view showing a series-connected zener diode and secondary battery arranged to form a slave negative voltage supply circuit.
Figure 8:
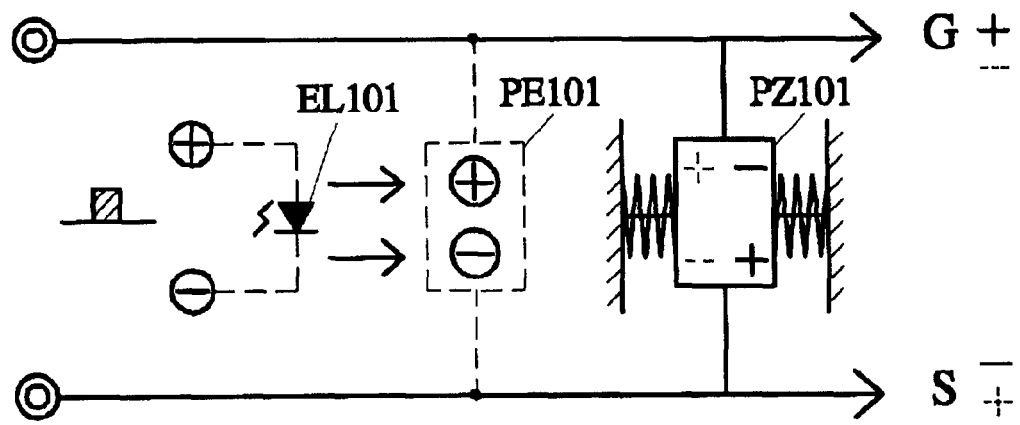
FIG. 8 is a view showing a parallel-connected pressure effect system having a pre-stressed structure and arranged to form a slave negative voltage supply circuit.
Figure 9:
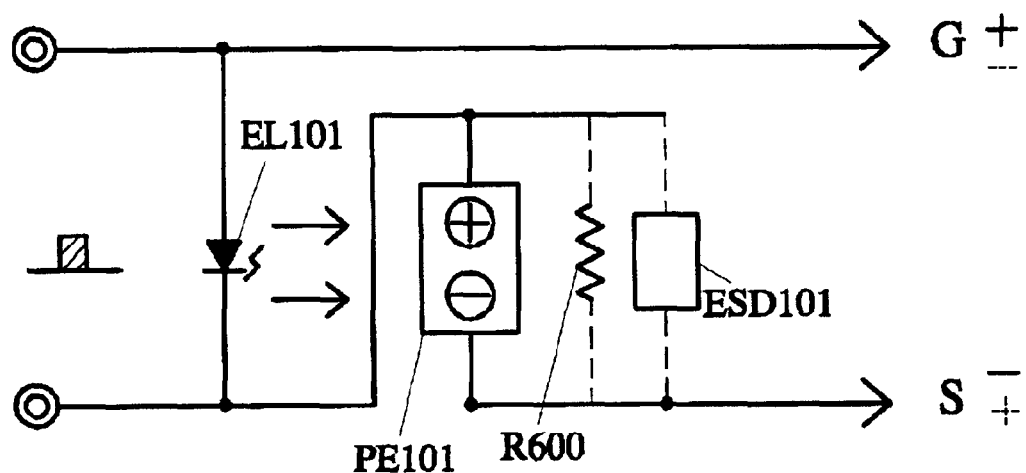
FIG. 9 is a view showing a slave negative voltage supply circuit including a series-connected, inverse polarity photoelectric conversion device.
Figure 10:
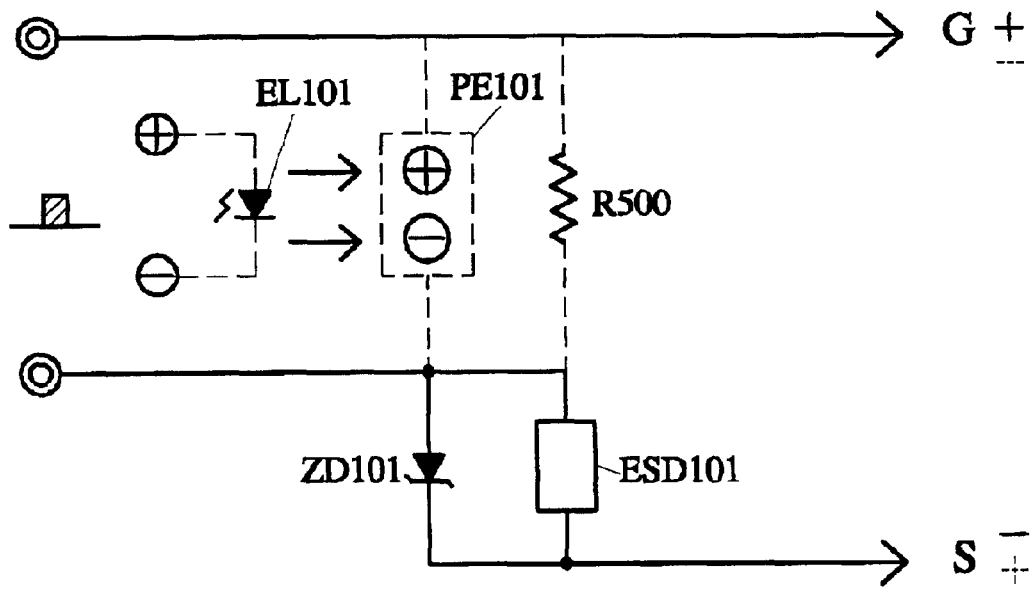
FIG. 10 is a view showing a slave negative voltage supply circuit in which the photoelectric conversion light emission device of the present invention is connected in series with a zener diode and a capacitor.
Figure 11:
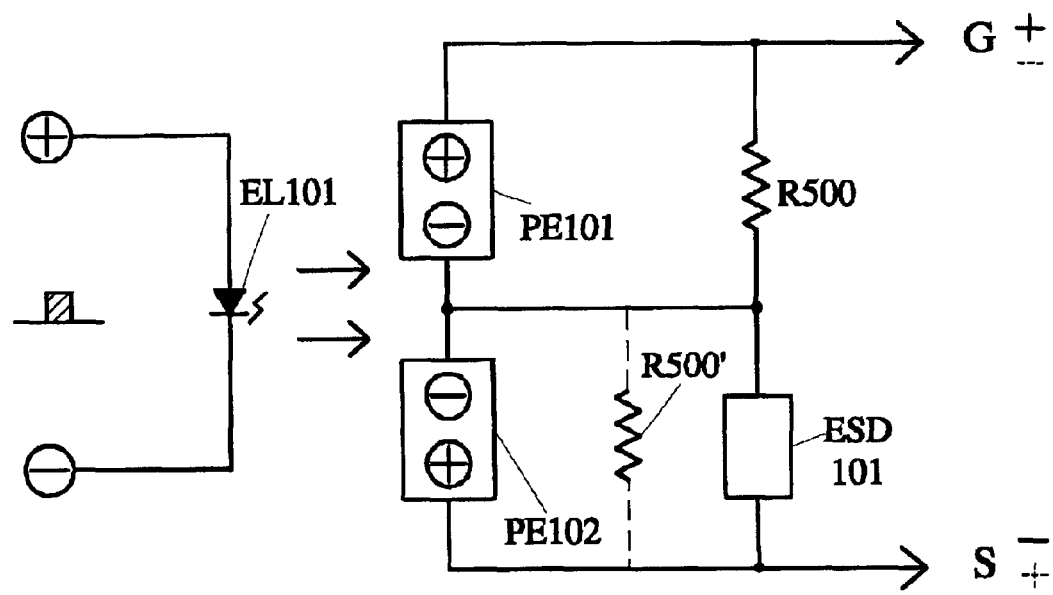
FIG. 11 is a view showing a circuit provided with a negative voltage storage device that simultaneously excites two photoelectric conversion devices connected in series of inverse polarity coupled to the electric light emission device from a signal source.
Figure 12:
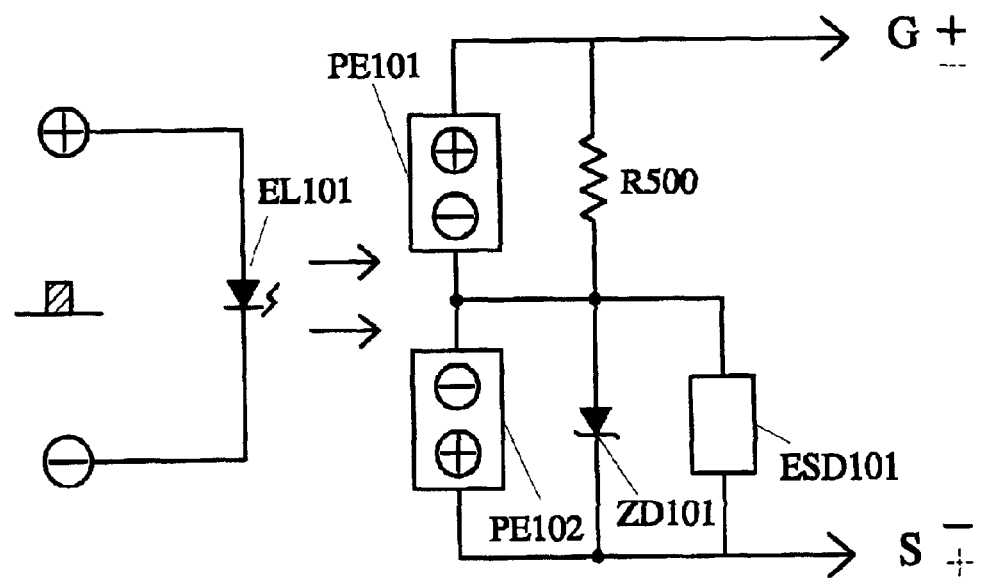
FIG. 12 is a view showing another circuit provided with a negative voltage storage device that simultaneously excites two photoelectric conversion device connected in series of inverse polarity coupled to the electric light emission device from a signal source.

The slave negative voltage supply circuit device VB101 provided in the photoelectric conversion drive circuit of the transistor may be a combination of an electro-mecanical device or a solid-state device, with various types of electric energy of positive voltage functioning as the input drive for the high input resistance transistor Q101 and at the same time being transferred to and stored in the slave negative voltage supply circuit device VB101 so to function as a negative voltage source to assist in cutoff when the high input resistance transistor Q101 is cut off. The negative voltage supply circuit device VB101 takes advantage of the photo energy generated when the electric energy driven light emission device emits light and the photoelectric conversion device PE101 or PE102 is excited to generate the positive voltage electric energy required to drive the high input resistance transistor, the positive voltage electric energy being transferred to and stored in the slave negative voltage supply circuit device VB101 so to function as a negative voltage source to help energy transformation when the high input resistance transistor Q101 is cut off. The slave negative voltage supply circuit device VB101 can take a variety of forms, and the following preferred embodiments are given only as examples and not intended to be limiting:

a. As illustrated in FIG. 2, the slave negative voltage supply circuit is comprised of a parallel-connected inductor. The input end of the high input resistance transistor Q101 is used to connect an induction L101 in parallel so that when an interruption occurs in the external signal source or the positive voltage signal source used to drive the high input resistance transistor Q101 and supplied from the photoelectric conversion device PE101, as controlled by the electric energy driven light emission device EL101, the induction L101 generates an inverse negative voltage and supplies it to the input end of the high input resistance transistor Q101 to improve its cutoff characteristics;

b. FIG. 3 shows that a slave negative voltage supply circuit comprised of the present invention includes a parallel-connected inductor and capacitor. The input end of the high resistance transistor Q101 is connected in parallel with induction L101 and capacitors C101 so that when an external signal source or the positive voltage signal source supplied from the photoelectric conversion device PE101, as controlled by the electric energy driven light emission device EL101, is interrupted, the induction L101 and the capacitor C101 connected in parallel are used to generate an inverse negative voltage and supply it to the input end of the high resistance transistor Q101 to improve its cutoff characteristics;

c. FIG. 4 shows a slave negative voltage supply circuit that includes a series-connected induction. The induction L101 is connected in series between the input of the high input resistance transistor Q101 and the source of positive drive voltage so that when an external signal source or the positive voltage source supplied from the photoelectric conversion device PE101, as controlled by the electric energy driven light emission device EL01 is interrupted, the induction L101 generates an inverse negative voltage and supplies it to the input end of the high input resistance transistor Q101 to improve its cut off characteristics, a secondary resistance R500 being optionally connected in parallel with both ends of the photoelectric conversion device PE101 as required to provide a loop for the inverse negative voltage;

d. As illustrated in FIG. 5, a slave negative voltage including a series-connected parallel combination of an induction L101 and capacitor C101 so that when an external signal source or the positive voltage source supplied from the photoelectric conversion device PE101, as controlled by the electric energy driven light emission device EL101, is interrupted, a parallel harmonic oscillator comprising the inductor L101 and capacitor C101 in parallel is connected in series between the high input resistance transistor Q101 and the signal source of drive positive voltage, and an inverse negative voltage is generated and supplied to the input end of the high input resistance transistor Q101 to improve its cutoff characteristics. A secondary resistance R500 may be connected as required in parallel with both ends of the photoelectric conversion device PE101 to provide a loop for the inverse negative voltage;

e. FIG. 6 shows a slave negative voltage supply circuit including a series-connected resistance and a secondary battery system. The secondary battery system ESD101 is comprised of a capacitor secondary (dis)chargeable battery and the resistance R400 in parallel, and is connected in series between the drive signal source and the input of the high input resistance transistor Q101. The secondary resistance R500 is connected in parallel with either side of a connection of the combination of the drive signal source and the resistance R400 and another end of the signal source of the drive positive voltage so as to permit the drive signal source or the photoelectric conversion device PE101 generate electricity when subject to light and thus generate a positive voltage to drive the high input resistance transistor Q101; the positive voltage also forming a voltage drop across the resistance R400 so to charge a negative voltage into both ends of the secondary electricity storage device ESD101; wherein when the positive voltage is interrupted, the negative voltage stored in the secondary electricity storage device ESD101 forms, through the secondary resistance R500, a negative voltage and supplies it to the input end of the high input resistance transistor Q101 to improve its cutoff characteristics;

f. FIG. 7 shows a slave negative voltage supply circuit comprised of having the present invention connected in series with a combination of a zener diode and a secondary electricity storage device in parallel. The secondary electricity storage device ESD101 is comprised of a capacitor or a secondary (dis)chargeable battery and a parallel combination of a zener diode ZD101 and a secondary electricity storage device ESD101, which is connected in series between the drive signal source and the input of the high input resistance transistor Q101, and secondary resistances R500 and R500' respectively connected in parallel with both ends of the combination of the zener diode ZD101 and the drive signal source, so to have the drive signal source or the photoelectric conversion device PE101, as controlled by the electric energy driven light emission device EL101, generate electricity when subject to light, thus generating a positive voltage to drive the high input resistance transistor Q101; and in addition to driving the high input resistance transistor Q101, the zener voltage of the zener diode ZD101 is used to form a voltage drop at both ends of the secondary electricity device ESD101 so to charge the negative voltage into both ends of the secondary electricity storage device ESD101. When the signal source of the positive voltage is interrupted, the negative voltage stored in the secondary electricity storage device ESD101 forms, through the secondary resistances R500 and R500', a negative voltage and supplies it to the input end of the high input resistance transistor Q101 to improve its cutoff characteristics.

g. FIG. 8 shows a slave negative voltage supply circuit that includes a parallel-connected pressure effect device of a pre-stressed structure. The pressure effect device PZ101 is connected in parallel between the drive signal source and the input end of the high input resistance transistor, and includes any device with a pressure effect that is pre-compressed by means of the pre-stressed structure so that it is normally under negative voltage status while the light emission device EL101 is used to control the operation of the photoelectric conversion device PE101 to generate a positive voltage and drive the high input resistance transistor Q101; meanwhile, by taking advantage of the pressure effect, the pressure effect device PZ101 indicates its transformation in opposition to the pre-stressed direction so that when the positive voltage drive signal is interrupted, the pressure effect device PZ101 supplies a negative voltage to the input end of the high input resistance transistor Q101 by pre-stress restoration for improving its cutoff characteristics;

h. FIG. 9 shows a slave negative voltage supply circuit comprised of an inverse series-connected photoelectric conversion device having a polarity opposite to that of the drive signal. More specifically, the photoelectric conversion device PE101 with selected output voltage is connected in series of inverse polarity between the drive signal source and the input of the high input resistance transistor, and the secondary electricity storage device ESD101 comprised of a capacitor or a secondary (dis)chargeable battery is connected in parallel with both ends of the photoelectric conversion device. A secondary resistance R600 may be further connected in parallel as required while the electric energy driven light emission device EL101 is coupled, in parallel with the input end of the drive signal, to the photoelectric conversion device PE101. In addition to driving the high input resistance transistor Q101, the input of electric energy from the positive voltage signal also causes the electric energy driven light emission device EL101 to emit light at the same time so as to excite the photoelectric conversion device PE101 for generating a negative voltage output and charge the secondary electricity storage device ESD101, provided that upon the electric energy of the positive voltage signal being interrupted, the secondary electricity storage device ESD101 delivers a negative voltage into the input end of the high input resistance transistor Q101 to improve its cutoff characteristics;

i. FIG. 10 shows that a slave negative voltage circuit comprised of a zener diode and capacitors connected in series at the output end of the photoelectric conversion device coupled to the electric energy driven light emission device of the present invention. The drive signal source is used to drive the electric energy driven light emission device EL101 to excite the photoelectric conversion device PE101 with selected output voltage coupled to the electric energy driven light emission device EL101, and a zener diode ZD101 and the secondary electricity storage device ESD101 comprised of a capacitor or/a secondary (dis)chargeable battery connected in parallel with both ends of the zener diode are connected in series between the photoelectric conversion device and the input end of the high input resistance transistor Q101, so that a positive driving voltage is generated when electric energy from an external signal source is inputted, or when the photoelectric conversion device PE101 coupled as controlled by the electric energy driven light emission device EL101 generates electricity, to drive the high input resistance transistor Q101 through the zener diode ZD101, and to charge the secondary electricity device ESD101 in parallel with both ends of the zener diode ZD101. When the signal of positive voltage is interrupted, the secondary electricity device ESD101 inputs a negative voltage to the input end of the high input resistance transistor Q101 to improve its cutoff characteristics if required, the secondary resistance R500 may be connected in parallel with the output end of the photoelectric conversion device;

j. FIG. 11 shows an embodiment in which the electric energy driven light emission device provided at the signal source of the present invention is used to simultaneously excite two photoelectric conversion devices connected in series with inverse polarity and coupled to the electric energy driven light emission device while an electricity storage device circuit for negative voltage is also provided. The drive signal source is used to drive the electric energy driven light emission device EL101 to excite the two photoelectric conversion devices PE101 and PE102 having different values of rated output voltage, the secondary electricity storage device ESD101 being comprised of capacitors or a secondary (dis) chargeable battery connected in parallel with both output ends of the photoelectric conversion device PE102 having the lower rated output voltage such that upon the input of electric energy from the positive voltage signal, the electric energy driven light emission device EL101 is excited to emit light, and both of the two photoelectric conversion devices PE101 containing higher rated output voltage and PE102 having the lower rated output voltage that are connected in series in inverse direction and coupled to the electric energy driven light emission device EL101 are excited to generate electricity at the same time. Meanwhile, the circuit supplies, at the input end of the high input resistance transistor Q101, a positive voltage input of the voltage difference between the two photoelectric conversion devices PE101 and PE102 so to cause the high input resistance transistor Q101 to conduct and execute negative voltage charging on the secondary electricity storage device ESD101. Then, the electric energy is outputted through the secondary resistance R500 to the high input resistance transistor Q101 to facilitate its cut-off. The secondary resistance R500' may be connected in parallel with both ends of the secondary electricity storage device ESD101 as required by the circuit;

k. FIG. 12 shows another example of using an electric energy driven light emission device provided at the signal source of the present invention to simultaneously excite two photoelectric conversion devices connected in series of inverse polarity and coupled to the electric energy driven light emission device while an electricity storage device circuit for negative voltage is also provided. The drive signal source is used to drive the electric energy driven light emission device EL101 to excite the two photoelectric conversion devices PE101 and PE102 with selected output voltage connected in series of inverse polarity and arranged to supply the input end of the high input resistance transistor Q101 in the photo energy driven light emission device with a negative voltage, a secondary electricity storage device ESD101 being comprised of capacitors or a secondary (dis)chargeable battery connected in parallel with both output ends of the photoelectric conversion device PE102 and further connected in parallel with the zener diode ZD101 having its zener voltage lower than the rated voltage of the photoelectric conversion device PE101. Upon input of electric energy from the positive voltage signal, the electric energy driven light emission device EL101 is excited to emit light, and both of the two photoelectric conversion devices PE101 and PE102 that are connected in series in inverse direction and coupled to the electric energy driven light emission device EL101 are excited to generate electricity at the same time. Meanwhile, the circuit provides at the input end of the high input resistance transistor Q101 a positive voltage input through the zener diode ZD101 to cause conduction of the high input resistance transistor Q101 and to execute negative voltage charging of the secondary electricity storage device ESD101 connected in parallel with both ends of the zener diode.

Figure 13:
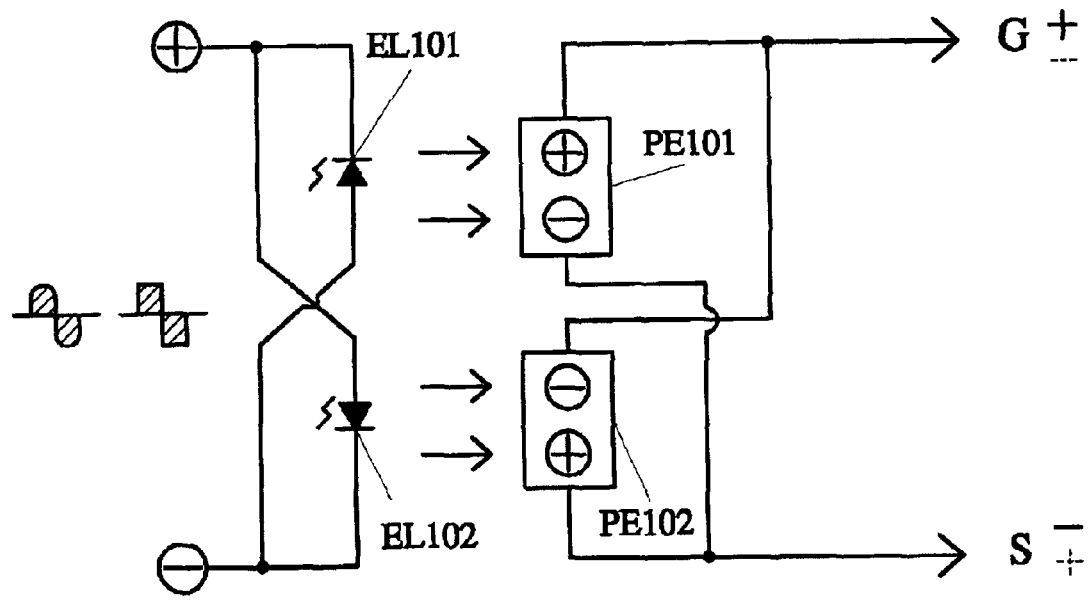
FIG. 13 is a view showing a circuit including two electric energy driven light emission devices connected to two photoelectric conversion device connected in parallel with inverse polarity.
Figure 14:
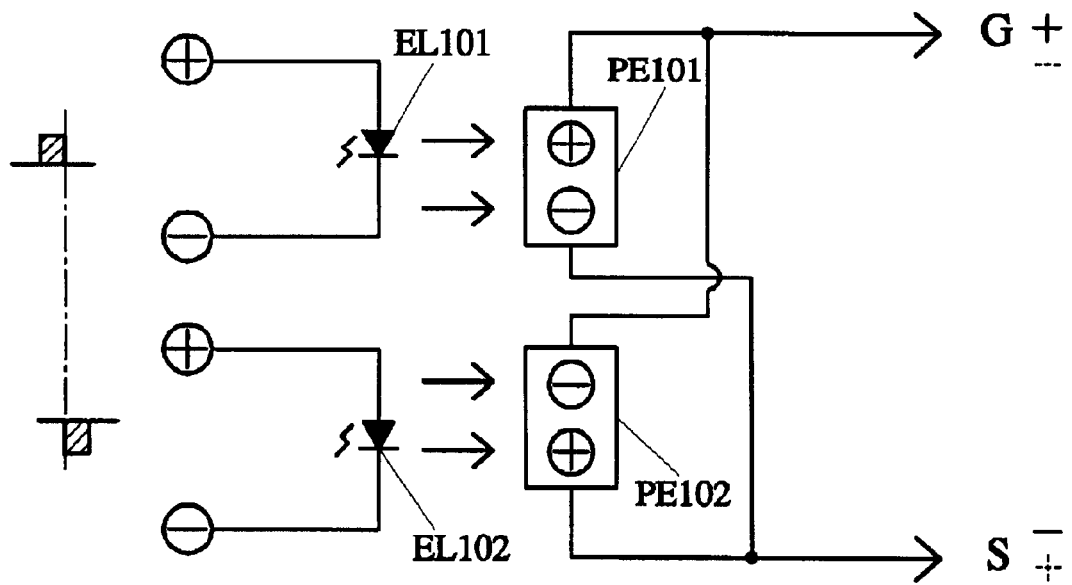
FIG. 14 is a view showing a circuit wherein two individual electric energy driven light emission devices are used to control the operation of two photoelectric conversion devices connected in parallel with inverse polarity.
Figure 15:
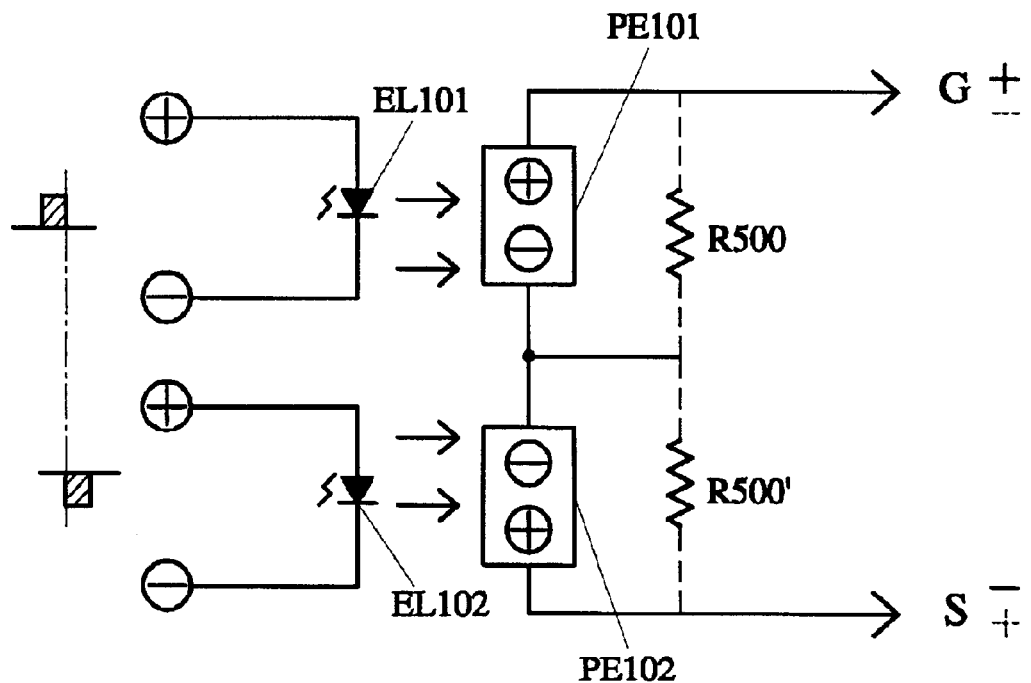
FIG. 15 is a view showing another circuit wherein two individual electric energy driven light emission device are used to control the operation of two photoelectric conversion devices connected in parallel with inverse polarity.
Figure 16:
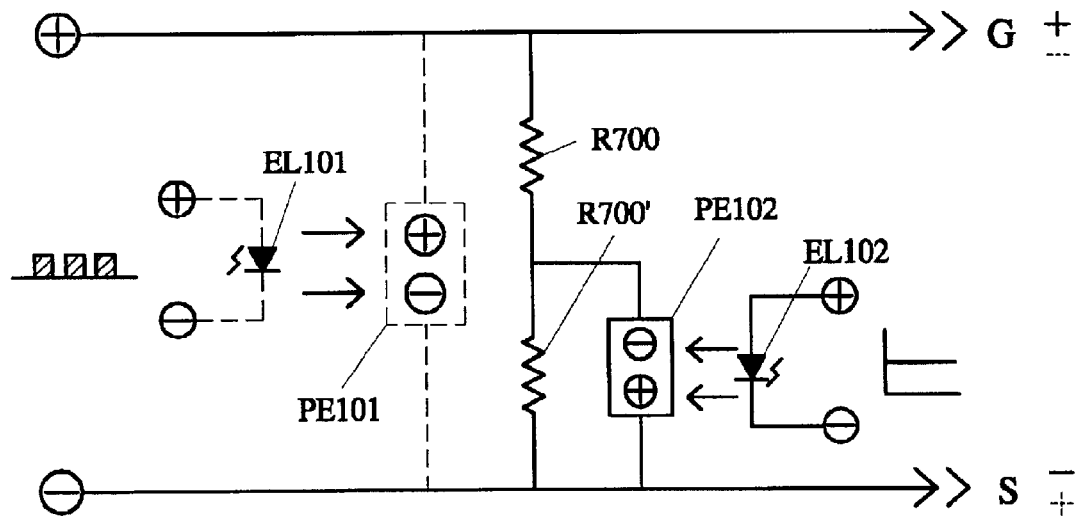
FIG. 16 is a preferred embodiment of the present invention comprised of a constant negative electric energy device.
Figure 17:
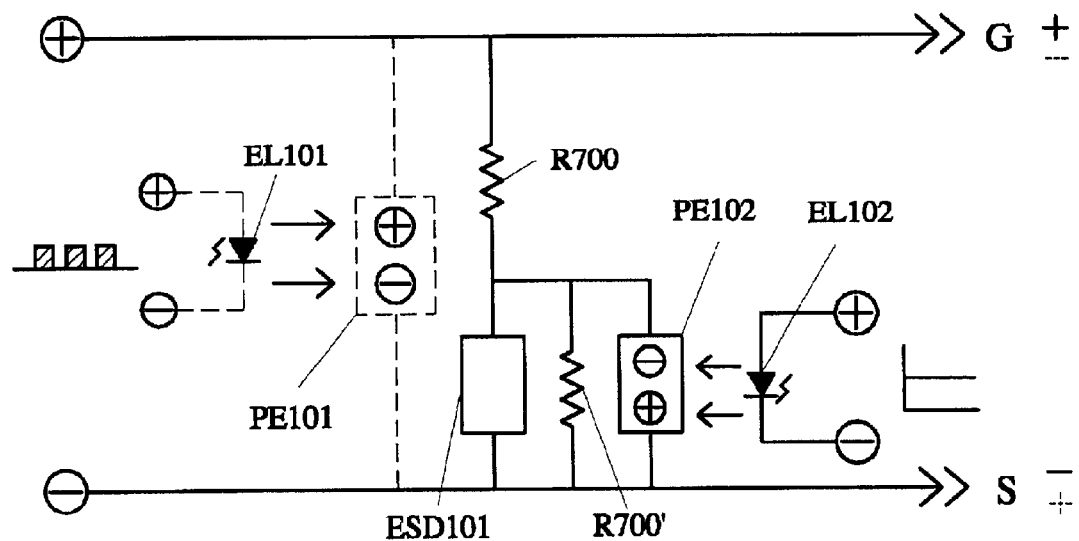
FIG. 17 is a preferred embodiment of the present invention also comprised of a constant negative electric energy device.
Figure 18:
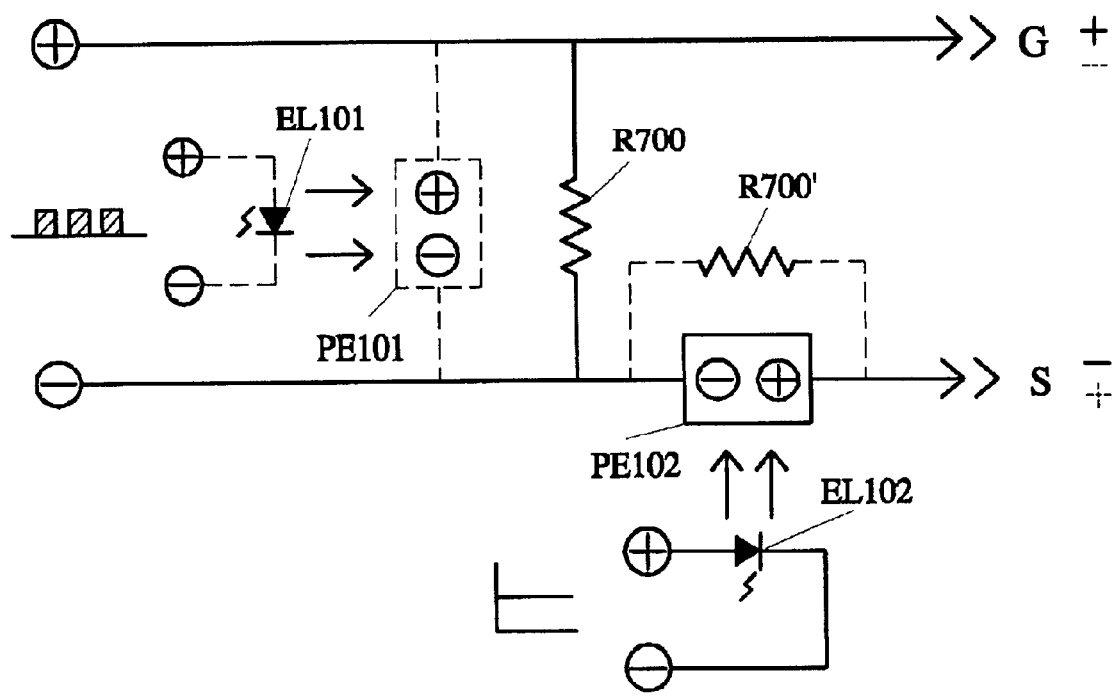
FIG. 18 is another preferred embodiment of the present invention comprised of a constant negative electric energy device.

When the electric energy from the positive voltage signal is interrupted and the electric energy driven light emission device EL101 stops light emission, the electric energy of negative voltage from the secondary electricity storage device ESD101 is outputted through the secondary resistance R500 connected in parallel with both ends of the photoelectric conversion device PE101 to the high input resistance transistor Q101 to facilitate its cut-off;

l. As illustrated in FIG. 13, a circuit of the present invention is comprised of two electric energy driven light emission devices EL101 and EL102 and two photoelectric conversion devices PE101, PE102 connected in parallel with inverse polarity. The two electric energy driven light emission devices EL101 and EL102 are driven by a two-way drive signal source, and the two photoelectric conversion devices PE101 and PE102 with selected output voltage are connected in parallel with inverse polarity and coupled to the two electric energy driven light emission devices EL101 and EL102 in order to output a positive voltage to the input end of the high input resistance transistor Q10I. When the input signal source is a positive conduction signal that causes the positive conduction electric energy driven light emission device EL101 to emit light, the photoelectric conversion device PE10I coupled to it generates electric energy of positive polarity to drive the high input resistance transistor Q10I to conduct. When the positive signal from the input signal source is cut off and turned into a negative signal, the electric energy of positive polarity outputted to the high resistance transistor is cut off, i.e. the electric energy driven light emission device EL102 emitting the light in inverse direction emits light to excite the photoelectric conversion device PE102 coupled to it for emitting light to generate electric energy of negative polarity,which is output to the input end of the high input resistance transistor Q101 for improving its cutoff characteristics;

m. FIG. 14 shows a circuit comprised of two individual electric energy driven light emission devices used to control the operation of two photoelectric conversion devices connected in parallel with inverse polarity. The two individual electric energy driven light emission devices EL101 and EL102 are driven by a two-way drive signal source, and the two photoelectric conversion devices PE101 and PE102 are provided with a selected output voltage and connected in parallel with inverse polarity for output to input ends of the high input resistance transistor Q101. When the input signal source provides a positive conduction signal to drive its matching electric energy driven light emission device EL101, the photoelectric conversion device PE101 coupled to it generates electricity of positive polarity to drive the high input resistance transistor Q101 to turn on. When the positive signal from the input signal source is cut off and turns into a negative signal, the electric energy of positive polarity outputting to the high input resistance transistor Q101 is also cutoff while the other photoelectric conversion device PE102 used also for cutoff starts to emit light to generate electric energy of negative polarity for outputting to the input end of the high input resistance transistor Q101 to improve its cutoff characteristics;

n. FIG. 15 shows a circuit according to the present invention that controls the operation of two photoelectric conversion devices of inverse polarity using two individual light emission devices driven by electric energy. The two respectively provided electric energy driven light emission devices EL101 and EL102 are driven by a two-way drive signal source, and two photoelectric conversion devices PE101 and PE102 with selected output voltage are connected in series with inverse polarity and coupled to the two individual electric energy driven light emission devices EL101 and EL102. When the input signal source provides a positive conduction signal to drive its matching electric energy driven light emission device EL101, the photoelectric conversion device PE101 coupled to it generates electric energy of positive polarity to drive the high input resistance transistor Q101 to conduct. When the positive signal from the input signal source is cut off and turns into a negative signal, the electric energy of positive polarity outputting to the high input resistance transistor Q101 is also cut off while the other photoelectric conversion device EL102 used for cutoff starts to emit light to generate electric energy of negative polarity for outputting to the input end of the high input resistance transistor Q10I to improve its cutoff characteristics. The individual output end of the two photoelectric conversion devices connected in series of inverse polarity may be respectively connected in parallel with resistances R500 and R500' as required;

o. FIG. 16 shows another preferred embodiment of the present invention provided with a source of negative polarity. A fixed source or a drive signal is used to drive an electric energy driven light emission device EL102 to generate photo energy for exciting the photoelectric conversion device PE102 and generate electric energy of negative polarity that is coupled to the electric energy driven light emission device EL102 to control the operation of the electric energy driven light emission device EL101 and thereby generate photo energy for exciting the photoelectric conversion device PE101 coupled to it to generate electric energy of positive polarity. Then, the photo energy is further outputted to the input end of the high input resistance transistor Q101, with both input ends of the high input resistance transistor Q101 connected in parallel and further connected in series with a secondary resistance R700 and another resistance R700'. The photoelectric conversion device PE102 provided for generating electric energy of negative polarity has an inverse polarity connection to the secondary resistance R700' for constantly supplying electric energy of negative polarity to the input end of the high input resistance transistor Q101. When the drive signal source is interrupted, the electric energy of positive polarity outputted to the high input resistance transistor Q101 is also cut off, and the electric energy of negative polarity outputted from the photoelectric conversion device PE102 is conducted to the high input resistance transistor Q101 to improve its cutoff characteristics. The fixed source may come from a main power line, a dedicated secondary power source, or a secondary source shared by another source circuit;

p. FIG. 17 shows another preferred embodiment of the present invention provided with a source of negative polarity. A fixed source or a drive signal is used to drive an electric energy driven light emission device EL102 to generate photo energy for exciting the photoelectric conversion device PE102 to generate electric energy of negative polarity that is coupled to the electric energy driven light emission device EL102, while the drive signal is directly inputted to control the operation of the electric energy driven light emission device EL101 and generate photo energy for exciting the photoelectric conversion device PE101 coupled to it and providing for generating electric energy of positive polarity. The photo energy is further outputted to the input end of the high input resistance transistor Q101 with both input ends of the high input resistance transistor Q101 connected in parallel with a circuit comprised of a secondary resistance R700 and the secondary electricity device ESD101 connected in series; the photoelectric conversion device PE102 provided for generating electric energy of negative polarity being connected in parallel with the secondary electricity storage device ESD101 for constantly supplying electric energy of negative polarity to the input end of the high input resistance transistor Q101. When the drive signal source is interrupted, the electric energy of positive polarity outputted to the high input resistance transistor Q101 is also cut off, and the electric energy of negative polarity outputted from the photoelectric conversion device PE102 is conducted to the high input resistance transistor Q101 to improve its cutoff characteristics. The fixed source may come from a main power line, a dedicated secondary power source, or a secondary source shared by another source circuit, and a secondary resistance R700' may be provided at both ends of the photoelectric conversion device PE102; and q. FIG. 18 shows yet another preferred embodiment of the invention that is provided with a power source of negative polarity. A fixed source or a drive signal is used to drive an electric energy driven light emission device EL102 to generate photo energy for exciting the photoelectric conversion device PE102 and generate electric energy of negative polarity that is coupled to the electric energy driven light emission device EL102, while the drive signal source is directly inputted or driven to control the operation of the electric energy driven light emission device EL101 to relatively generate photo energy for exciting the photoelectric conversion device PE101 coupled to it and generate electric energy of positive polarity. When both output ends of the photoelectric conversion device PE101 are connected in parallel with the secondary resistance R700, and then further connected in series with the photoelectric conversion device PE102 of inverse polarity and inputted to the input end of the high resistance transistor Q101, the rated output voltage of the photoelectric conversion device PE102 is lower than the rated output voltage of the photoelectric conversion device PE102 and control by the drive signal over the operation of the high input resistance transistor Q101 if not affected. When the drive signal source is interrupted, the electric energy of positive polarity outputted to the high input resistance transistor Q101 is also cut off, and the electric energy of negative polarity is outputted to the high input resistance transistor Q101 to improve its cutoff characteristics. The fixed source may come from a main power line, a dedicated secondary power source, or a secondary source shared by anther source circuit, and a secondary resistance R700' may be respectively provided at both ends of the photoelectric conversion device PE102.

As disclosed above, the photoelectric conversion transistor drive circuit uses an electric energy driven light emission device or a natural light source from the environment as the working light source to control the operation of a photoelectric conversion device which, when coupled to the light emission device, generates a drive voltage and charges slave negative voltage supply circuit device VB101, thereby providing a pilot drive circuit of a high input resistance transistor, such as a micro type or power type metal-oxide-silicon field effect transistor (MOSFET), an insulated gate bipolar transistor (IGBT), or any other high input resistance transistor or module to achieve excellent control and operation either in the drive mode or during cutoff.

What is claimed is:

1. A drive circuit for a high input resistance transistor device, comprising:
    a photoelectric conversion device connected to a gate of a high input resistance transistor device, wherein the photoelectric conversion device is arranged to generate a positive drive voltage for supply to the gate upon receiving light energy from an ambient light source or an electrically driven light emission device;
    a slave negative voltage supply device connected between the gate and source of the high input resistance transistor device, wherein the slave negative voltage supply device stores a portion of the positive drive voltage and, upon cut-off of the positive drive voltage, supplies a negative voltage to the gate of the high input resistance transistor in order to improve cut-off characteristics of the high input resistance transistor.

2. A drive circuit for a high input resistance transistor device as claimed in claim 1, wherein said high input resistance transistor device includes a MOSFET.

3. A drive circuit for a high input resistance transistor device as claimed in claim 1, wherein said high input resistance transistor device includes an IGBT.

4. A drive circuit for a high input resistance transistor device as claimed in claim 1, wherein said high input resistance transistor device is a transistor module.

5. A drive circuit for a high input resistance transistor device as claimed in claim 1, wherein said slave negative voltage supply device includes an inductor connected in parallel between the photoelectric conversion device and the high input resistance transistor device.

6. A drive circuit for a high input resistance transistor device as claimed in claim 5, wherein said slave negative voltage supply device further includes a capacitor connected in parallel between ends of the inductor.

7. A drive circuit for a high input resistance transistor device as claimed in claim 1, wherein said slave negative voltage supply device includes an inductor connected in series between the photoelectric conversion device and the gate of the high input resistance transistor, said inductor having a polarity opposite to a drive current direction.

8. A drive circuit for a high input resistance transistor device as claimed in claim 7, wherein said slave negative voltage supply device further includes a resistor connected in parallel between the photoelectric conversion device and the high input resistance transistor device.

9. A drive circuit for a high input resistance transistor device as claimed in claim 7, wherein said slave negative voltage supply device includes a capacitor connected in parallel between ends of the inductor.

10. A drive circuit for a high input resistance transistor device as claimed in claim 1, wherein said slave negative voltage supply device includes a secondary battery system connected in series between the photoelectric conversion device and a source of the high input transistor device, and a resistance connected in parallel with either side of the secondary battery system.

11. A drive circuit for a high input resistance transistor device as claimed in claim 10, wherein said secondary battery system comprises a capacitor or rechargeable secondary battery connected in parallel with a second resistance.

12. A drive circuit for a high input resistance transistor device as claimed in claim 1, wherein said slave negative voltage supply device includes a secondary battery system and zener diode connected in parallel between the photoelectric conversion device and the high input resistance transistor device.

13. A drive circuit for a high input resistance transistor device as claimed in claim 12, wherein said secondary battery system comprises a capacitor or rechargeable secondary battery and resistances connected in parallel with both ends of the zener diode and photoelectric conversion device.

14. A drive circuit for a high input resistance transistor device as claimed in claim 1, wherein said slave negative voltage supply device includes a parallel-connected pressure effect device having a pre-stressed structure.

15. A drive circuit for a high input resistance transistor device as claimed in claim 1, wherein the photoelectric conversion device is inverse series-connected with a polarity opposite to that of the positive drive voltage, and further comprising a secondary electricity storage device connected in parallel between both ends of the photoelectric conversion device.

16. A drive circuit for a high input resistance transistor device as claimed in claim 15, wherein said secondary battery system comprises a capacitor or rechargeable secondary battery and a resistance connected in parallel between the photoelectric conversion device and the capacitor or rechargeable secondary battery.

17. A drive circuit for a high input resistance transistor device as claimed in claim 1, wherein said slave negative voltage supply device includes a secondary battery system and zener diode connected in series between the photoelectric conversion device and the high input resistance transistor device.

18. A drive circuit for a high input resistance transistor device as claimed in claim 17, wherein said secondary battery system comprises a capacitor or rechargeable secondary battery and a resistance connected in series with the secondary battery system and zener diode, and in parallel with the photoelectric conversion device.

19. A drive circuit for a high input resistance transistor device as claimed in claim 1, further comprising a second inverse polarity photoelectric conversion device connected in series with the first photoelectric conversion device, and wherein said slave negative voltage supply device includes a secondary electricity storage device connected between ends of the second inverse polarity photoelectric conversion device for storing a negative voltage generated by the second inverse polarity photoelectric conversion device upon receipt of light energy from the light emission device.

20. A drive circuit for a high input resistance transistor device as claimed in claim 19, further comprising a resistor connected in parallel between said second inverse polarity photoelectric conversion device and the secondary electricity storage device.

21. A drive circuit for a high input resistance transistor device as claimed in claim 19, further comprising a zener diode connected in parallel between said second inverse polarity photoelectric conversion device and the secondary electricity storage device.

22. A drive circuit for a high input resistance transistor device, comprising:
   a first light emission device;
   a first photoelectric conversion device connected to a gate of a high input resistance transistor device, wherein the first photoelectric conversion device is arranged to generate a positive drive voltage for supply to the gate upon receiving light energy from the first light emission device;
   a second inverse polarity photoelectric conversion device connected between a gate and source of the high input resistance transistor device, wherein the second photoelectric conversion device is arranged to generate a negative drive voltage for supply to the high input resistance transistor device upon cut-off of the positive drive voltage in order to improve cut-off characteristic of the high input resistance transistor device.

23. A drive circuit for a high input resistance transistor device as claimed in claim 22, further comprising a secondary electricity storage device connected in parallel with the second inverse polarity photoelectric conversion device for storing said negative drive voltage.

* * * * *